(12) United States Patent
Nakaya et al.

(10) Patent No.: US 9,796,086 B2
(45) Date of Patent: Oct. 24, 2017

(54) METHOD OF TEACHING ROBOT AND ROBOT

(71) Applicants: KAWASAKI JUKOGYO KABUSHIKI KAISHA, Kobe-shi, Hyogo (JP); Kawasaki Robotics(USA), Inc., Wixom, MI (US)

(72) Inventors: Atsushi Nakaya, Akashi (JP); Takao Yamaguchi, Freemont, CA (US); Hajime Nakahara, San Jose, CA (US); George Chin, San Leandro, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 104 days.

(21) Appl. No.: 14/702,333

(22) Filed: May 1, 2015

(65) Prior Publication Data

US 2016/0318182 A1 Nov. 3, 2016

(51) Int. Cl.
*G05B 19/04* (2006.01)
*G05B 19/18* (2006.01)
*B25J 9/16* (2006.01)
*H01L 21/67* (2006.01)
*H01L 21/68* (2006.01)

(52) U.S. Cl.
CPC ......... *B25J 9/163* (2013.01); *H01L 21/67259* (2013.01); *H01L 21/681* (2013.01); *Y10S 901/03* (2013.01); *Y10S 901/47* (2013.01)

(58) Field of Classification Search
CPC .. B25J 9/163; B25J 9/1697; B25J 9/22; Y10S 901/03; Y10S 901/47; H01L 21/68707; H01L 21/67259; H01L 21/68; H01L 21/681; H01L 21/67253; H01L 21/677; G01B 11/002; G06T 7/0004; G06T 7/004; G06T 7/0042; G06T 7/606; G06T 2207/30148; B65G 49/07
See application file for complete search history.

(56) References Cited

U.S. PATENT DOCUMENTS

| 5,194,743 | A | * | 3/1993 | Aoyama | ............... | H01L 21/681 |
| | | | | | | 250/548 |
| 6,760,976 | B1 | * | 7/2004 | Martinson | ......... | H01L 21/67265 |
| | | | | | | 33/520 |

(Continued)

*Primary Examiner* — Rachid Bendidi
(74) *Attorney, Agent, or Firm* — Oliff PLC

(57) ABSTRACT

A method of teaching a robot includes: a swinging step of causing a hand to swing about a predetermined pivot, which is on an axis perpendicular to an optical axis of a sensor beam, to scan a target in a horizontal direction of the sensor beam; a determining step of determining whether or not the target has coincided with a position along a central axis of the hand in its longitudinal direction based on a detection signal of a mapping sensor, the detection signal having changed owing to the swinging of the hand; and a shifting step of, if it is determined in the determining step that the target has not coincided with the position, calculating an offset amount of the hand based on the detection signal of the mapping sensor, the detection signal having changed owing to the swinging of the hand, and causing the hand to shift to either right or left along the optical axis of the sensor beam in accordance with the calculated offset amount.

6 Claims, 9 Drawing Sheets

(56) References Cited

U.S. PATENT DOCUMENTS

| | | | |
|---|---|---|---|
| 7,519,448 B2* | 4/2009 | Ikeda | G01B 11/002 |
| | | | 382/151 |
| 7,522,267 B2 | 4/2009 | Hofmeister et al. | |
| 7,933,665 B2* | 4/2011 | Sakiya | H01L 21/681 |
| | | | 700/121 |
| 9,275,886 B2* | 3/2016 | Fujimoto | G01B 11/002 |
| 2005/0034288 A1* | 2/2005 | Adachi | H01L 21/67259 |
| | | | 29/25.01 |
| 2006/0169208 A1* | 8/2006 | Shinozaki | G03F 7/7075 |
| | | | 118/715 |
| 2006/0222236 A1* | 10/2006 | Osada | H01L 21/681 |
| | | | 382/151 |
| 2007/0065144 A1* | 3/2007 | Hofmeister | H01L 21/67259 |
| | | | 396/611 |
| 2010/0124610 A1* | 5/2010 | Aikawa | C23C 16/4584 |
| | | | 427/255.28 |

\* cited by examiner

METHOD OF TEACHING ROBOT AND ROBOT

TECHNICAL FIELD

The present invention relates to a method of teaching a robot and the robot.

BACKGROUND ART

Generally speaking, in a semiconductor processing facility, a horizontal articulated link-type conveying robot is used for conveying a semiconductor wafer, a glass substrate for use in a display panel, or the like. In some cases, the distal end of a hand of the conveying robot is provided with a mapping sensor. The presence or absence of a substrate stored in a cassette is detected by the mapping sensor. For example, the hand includes two branching first and second distal end portions, and the mapping sensor is configured such that a sensor beam travels straight through space between the first and second distal end portions of the hand. In general, in the detection of an object by the mapping sensor, a position where the object blocks the sensor beam is recognized as a detected position of the object. Therefore, the position of the object in the direction of the beam of the mapping sensor cannot be specified. As one conventional technique, U.S. Pat. No. 752,267 discloses a technique of calculating the position of an object in an XY plane based on positions detected by a mapping sensor in two different orientations relative to the object (see Patent Literature 1, for example).

CITATION LIST

Patent Literature

PTL 1: U.S. Pat. No. 7,522,267

SUMMARY OF INVENTION

Technical Problem

However, in the above conventional method, if an actual position of the mapping sensor is different from a position recognized by a robot, then the calculated position will contain an error. In addition, due to accumulated errors, such as zeroing errors and mechanical dimensional errors of the robot, not only an angular error but also an error in the position in the XY plane occurs. As a result, there arises a problem in that the position of the object cannot be taught precisely.

In view of the above, an object of the present invention is to precisely specify the position of an object and improve the precision in teaching a robot.

Solution to Problem

A robot teaching method according to one aspect of the present invention is a method of teaching a robot, the robot including: a robot arm freely movable at least in two axial directions that are directions in an X-axis and a Y-axis; a hand mounted to a distal end of the arm and including two branching distal end portions that are a first distal end portion and a second distal end portion; a mapping sensor configured such that a sensor beam travels straight through space between the first and second distal end portions, the mapping sensor detecting whether or not a target has blocked the sensor beam; and a controller configured to control an operation of the robot arm. The method includes: a placing step of placing a target at a taught position; a first specifying step of causing the hand to advance straight from a predetermined position and specifying a position of the target in a forward-rearward direction as seen from the robot when the target has blocked the sensor beam; a swinging step of causing the hand to swing about a predetermined pivot, which is on an axis perpendicular to an optical axis of the sensor beam, to scan the target in a horizontal direction by means of the sensor beam; a determining step of determining whether or not the target has coincided with a position along a central axis of the hand in its longitudinal direction based on a detection signal of the mapping sensor, the detection signal having changed owing to the swinging of the hand; a shifting step of, if it is determined in the determining step that the target has not coincided with the position, calculating an offset amount of the hand based on the detection signal of the mapping sensor, the detection signal having changed owing to the swinging of the hand, and causing the hand to shift to either right or left along the optical axis of the sensor beam in accordance with the calculated offset amount; a second specifying step of if it is determined in the determining step that the target has coincided with the position, specifying a position of the target in a right-left direction as seen from the robot; and a teaching step of teaching the robot a position of the hand, the position corresponding to the taught position, based on the positions of the target specified in the forward-rearward direction and the right-left direction.

The mapping sensor is configured to perform the detection based on whether or not the target blocks the sensor beam passing through the space between the distal end portions of the hand. Therefore, the position of the target as seen from the robot can be specified only in one direction.

According to the above configuration, the hand is caused to swing about the predetermined pivot to scan the target in the horizontal direction by means of the sensor beam. The waveform of the detection signal of the mapping sensor changes. The offset amount is calculated based on the changing detection signal. The hand is caused to shift based on the calculated offset amount. In this manner, even if there are zeroing errors and dimensional errors of the robot, the target is made coincide with a position along the central axis of the hand in its longitudinal direction, i.e., coincide with the center of the line of the mapping sensor. This makes it possible to specify the plane position of the target as seen from the robot, and teach the robot the position of the hand, the position corresponding to the taught position, based on the specified position of the target.

The swinging step may include causing the hand to swing about the predetermined pivot, which is on the axis perpendicular to the optical axis of the sensor beam, to right and left by a same angle.

According to the above configuration, by causing the robot arm to swing to the right and left by the same angle relative to the central axis of the hand in its longitudinal direction, the offset amount can be suitably calculated from the detection signal of the mapping sensor.

The determining step may include determining whether or not the target has coincided with the position along the central axis of the hand in its longitudinal direction based on whether or not a value of the detection signal of the mapping sensor indicates symmetry in a predetermined swing angle range whose center is 0 degree.

According to the above configuration, the position of the target can be specified precisely.

The method may further include a step of calculating an inclination of the optical axis of the sensor beam relative to an axis in a reference coordinate system of the robot, and the shifting step may include causing the hand to shift along the optical axis of the sensor beam in a manner to maintain the calculated inclination.

The shifting direction of the hand is not necessarily parallel to each of the axes in the reference coordinate system of the robot. Therefore, by calculating an inclination of the optical axis of the sensor beam relative to an axis in the reference coordinate system of the robot in advance, the hand can be caused to shift precisely.

The placing step may include placing two targets at two taught positions, respectively. The first specifying step, the swinging step, the determining step, the shifting step, the second specifying step, and the teaching step may be performed for each of the two targets, and the method may further include an adjusting step of adjusting a deviation in a case of causing the hand to advance straight by a predetermined distance from the taught position of the hand based on relative positions of the specified positions of each of the targets and a design distance between the targets.

According to the above configuration, a deviation in the case of causing the hand to advance straight (e.g., from the edge of a substrate) by a predetermined distance (e.g., to the center of the substrate) can be suitably adjusted.

A robot according to another aspect of the present invention includes: a robot arm freely movable at least in two axial directions that are directions in an X-axis and a Y-axis; a hand mounted to a distal end of the arm and including two branching distal end portions that are a first distal end portion and a second distal end portion; a mapping sensor configured such that a sensor beam travels straight through space between the first and second distal end portions, the mapping sensor detecting whether or not a target has blocked the sensor beam; and a controller configured to control an operation of the robot arm. The controller: causes the hand to advance straight from a predetermined position, and in a state where the target is placed at a taught position, specifies a position of the target in a forward-rearward direction as seen from the robot when the target has blocked the sensor beam; causes the hand to swing about a predetermined pivot, which is on an axis perpendicular to an optical axis of the sensor beam, to scan the target in a horizontal direction by means of the sensor beam; determines whether or not the target has coincided with a position along a central axis of the hand in its longitudinal direction based on a detection signal of the mapping sensor, the detection signal having changed owing to the swinging of the hand; if it is determined that the target has not coincided with the position, calculates an offset amount of the robot arm based on the detection signal of the mapping sensor, the detection signal having changed owing to the swinging of the hand, and causes the hand to shift to either right or left along the optical axis of the sensor beam in accordance with the calculated offset amount; if it is determined that the target has coincided with the position, specifies a position of the target in a right-left direction as seen from the robot; and teaches the robot a position of the hand, the position corresponding to the taught position, based on the positions of the target specified in the forward-rearward direction and the right-left direction.

Advantageous Effects of Invention

The present invention makes it possible to precisely specify the position of an object and improve the precision in teaching a robot.

The above object, other objects, features, and advantages of the present invention will be made clear by the following detailed description of preferred embodiments with reference to the accompanying drawings.

DESCRIPTION OF EMBODIMENTS

Embodiment 1

Figure 1:
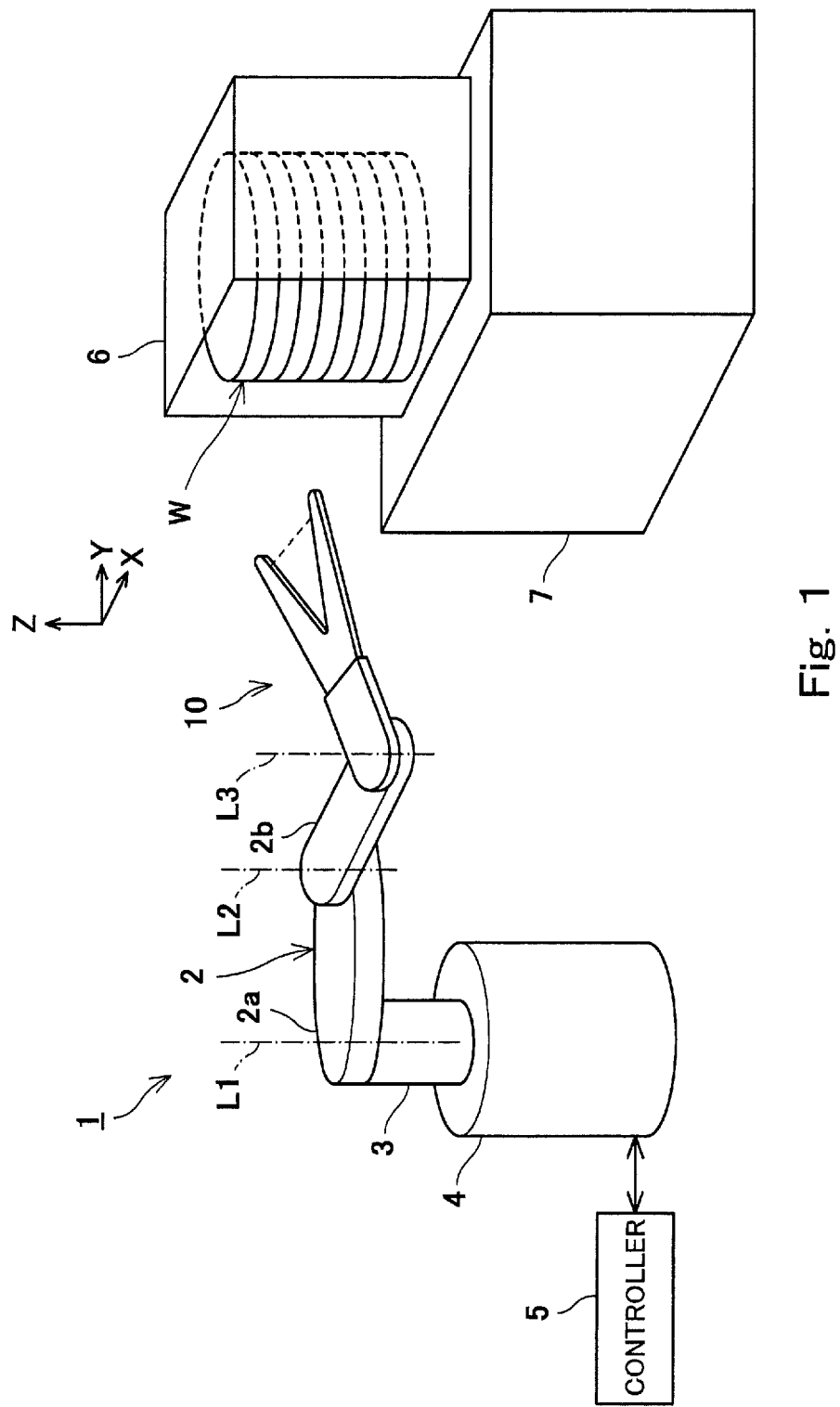
FIG. 1 is a schematic diagram showing the configuration of a robot according to Embodiment 1.

Hereinafter, Embodiment 1 of the present invention is described with reference to the drawings. In the drawings, the same or corresponding elements are denoted by the same reference signs, and repeating the same descriptions is avoided below.

FIG. 1 is a schematic diagram showing the configuration of a robot 1 according to Embodiment 1. As shown in FIG. 1, the robot 1 is installed, for example, in a semiconductor processing facility for manufacturing semiconductor elements. In the semiconductor processing facility, the robot 1 is utilized for conveying a substrate W, such as a wafer, which is a material of a semiconductor element. Examples of the wafer include a semiconductor wafer and a glass wafer. Examples of the semiconductor wafer include a silicon wafer, a wafer made of a single semiconducting material different from silicon, and a wafer made of a compound semiconducting material. Examples of the glass wafer include a glass substrate for use in FPD, a glass substrate for use in MEMS, and a sapphire (single crystal alumina) wafer. A plurality of treatment devices are installed in the semiconductor processing facility. For example, the treatment devices are devices for subjecting the wafer to heat treatment, impurity introducing treatment, thin film forming treatment, lithography treatment, cleaning treatment, and flattening treatment. The robot 1 conveys the substrate W to an area (a treatment chamber) in which these treatment devices are disposed. In the present embodiment, substrates W are stored on respective shelves in a cassette 6 mounted on a cassette stand 7.

Robot

For example, the robot 1 includes an arm 2, a lifting/lowering shaft 3, a base 4, a controller 5, and a hand 10. In the present embodiment, the substrate W is placed on the hand 10 of the robot 1, which is a horizontal articulated four-axis robot. A wrist freely movable in the horizontal direction is provided on the distal end of the arm 2 of the robot 1. The arm 2 is freely movable in three axial directions, i.e., X-axis, Y-axis, and Z-axis directions. The hand 10 is provided on the wrist.

The robot 1 includes the base 4, which is fixed to a suitable position (e.g., a floor) in the semiconductor processing facility. The lifting/lowering shaft 3 is provided on the base 4. On the base 4, the axis of the lifting/lowering shaft 3 extends vertically, for example. The base 4 includes a built-in actuator (not shown), which is an air cylinder, for example. When the actuator operates, the lifting/lowering shaft 3 is lifted or lowered vertically on the top surface side of the base 4.

The arm 2 includes a first arm 2a and a second arm 2b. The first arm 2a is provided on the upper end of the lifting/lowering shaft 3. The first arm 2a extends horizontally from the upper end of the lifting/lowering shaft 3. One end of the first arm 2a is connected to the lifting/lowering shaft 3 such that the first arm 2a is swingable about a vertical axis L1. The lifting/lowering shaft 3 includes a built-in actuator (not shown), which is an electric motor, for example. When the actuator operates, the first arm 2a swings in a horizontal plane relative to the lifting/lowering shaft 3.

The second arm 2b is provided on the upper surface side of the other end of the first arm 2a. The second arm 2b extends horizontally from the other end of the first arm 2a. One end of the second arm 2b is connected to the first arm 2a such that the second arm 2b is swingable about a vertical axis L2. The other end of the first arm 2a includes a built-in actuator (not shown), which is an electric motor, for example. When the actuator operates, the second arm 2b swings in a horizontal plane relative to the other end of the first arm 2a.

The hand 10, which is configured to hold a substrate W placed thereon, is provided on the upper surface side of the other end of the second arm 2b. The hand 10 is connected to the other end of the second arm 2b such that the hand 10 is swingable about a vertical axis L3. The other end of the second arm 2b includes a built-in actuator (not shown), which is an electric motor, for example. When the actuator operates, the hand 10 swings in a horizontal plane relative to the other end of the second arm 2b.

For example, either in accordance with an input from an operating device (not shown) or automatically, the controller 5 controls the operation of each of the actuators that drive the lifting/lowering shaft 3, the first arm 2a, the second arm 2b, and the hand 10, such that the hand 10 moves vertically and horizontally. By suitably controlling the operation speed of each actuator, the hand 10 can be caused to move along an intended path in a horizontal plane.

Hand

Figure 2:
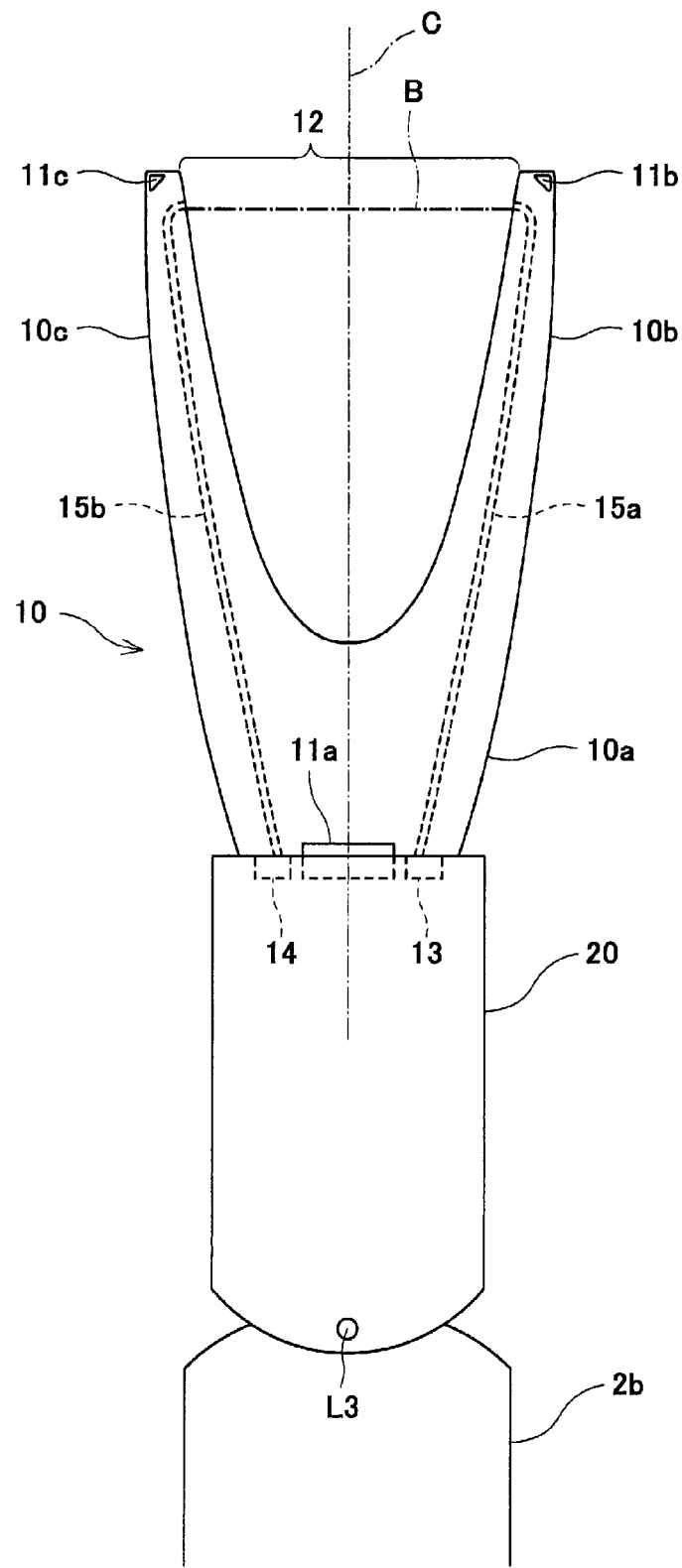
FIG. 2 is a plan view of a hand of FIG. 1.

FIG. 2 is a plan view of the hand 10 of FIG. 1 as seen from above. As shown in FIG. 2, the hand 10 is formed by using a plate material that is U-shaped when seen in plan view. In the present embodiment, the plate material has a symmetrical shape with respect to a central axis C of the U shape. The U-shaped body includes a single proximal end portion 10a and a pair of first and second distal end portions 10b and 10c. The first and second distal end portions 10b and 10c extend from the proximal end portion as two portions branching off from the proximal end portion. Space is formed between the first distal end portion 10b and the second distal end portion 10c. The proximal end portion 10a of the hand is fixed to one end of an attachment plate 20, and the body of the hand 10 extends horizontally from the attachment plate 20. The other end of the attachment plate 20 is connected to the other end of the second arm 2b such that the attachment plate 20 is swingable about the vertical axis L3.

The hand 10 is configured to hold a discoid substrate W placed thereon. In the present embodiment, the hand 10 includes a pushing surface 11a and two edge grips 11b. The pushing surface 11a and the edge grips 11b serve as substrate holders 11. The pushing surface 11a is provided on the upper surface of the proximal end portion 10a of the hand 10. The two edge grips 11b are provided on the upper surfaces of the first and second distal end portions 10b and 10C of the hand 10. The pushing surface 11a pushes the edge of the substrate W toward the edge grips 11b, thereby holding the substrate W together with the edge grips 11b.

A mapping sensor 12 is formed in an area extending from the first and second distal end portions 10b and 10c of the hand 10 across the space therebetween. The mapping sensor 12 is configured to face a substrate W and detect the presence or absence of the substrate W. The mapping sensor 12 is configured such that a sensor beam B travels straight through the space between the first distal end portion 10b and the second distal end portion 10c. The mapping sensor 12 detects whether or not the substrate W has blocked the sensor beam B. In the present embodiment, the central axis C, which extends in the longitudinal direction of the hand 10, coincides with the center of the sensor beam B.

The attachment plate 20 of the hand 10 includes a built-in light emitter 13. The light emitter 13 converts an electrical input from the controller 5 to generate detection light. One end of an optical fiber 15a is connected to the light emitter 13. The optical fiber 15a is laid to extend from the back side of the proximal end portion 10a of the hand to the back side of the distal end portion 10b of the hand. The optical fiber 15a guides the detection light emitted from the light emitter 13 to the back side of the distal end portion 10b of the hand. The attachment plate 20 of the hand 10 includes a built-in light receiver 14. The light receiver 14 receives the detection light and converts the detection light into an electrical output to the controller 5. One end of an optical fiber 15b is connected to the back side of the distal end portion 10c of the hand. The optical fiber 15b is laid to extend to the light receiver 14 built-in in the attachment plate 20 of the hand 10. The optical fiber 15b guides the detection light that is incident on the back side of the distal end portion 10c of the hand to the light receiver 14. It should be noted that a light-converging element (e.g., a convex lens) and a light-diverging element (e.g., a concave lens), which are not shown, may be disposed as necessary on both sides of each of the optical fibers 15a and 15b.

Control System

Figure 3:
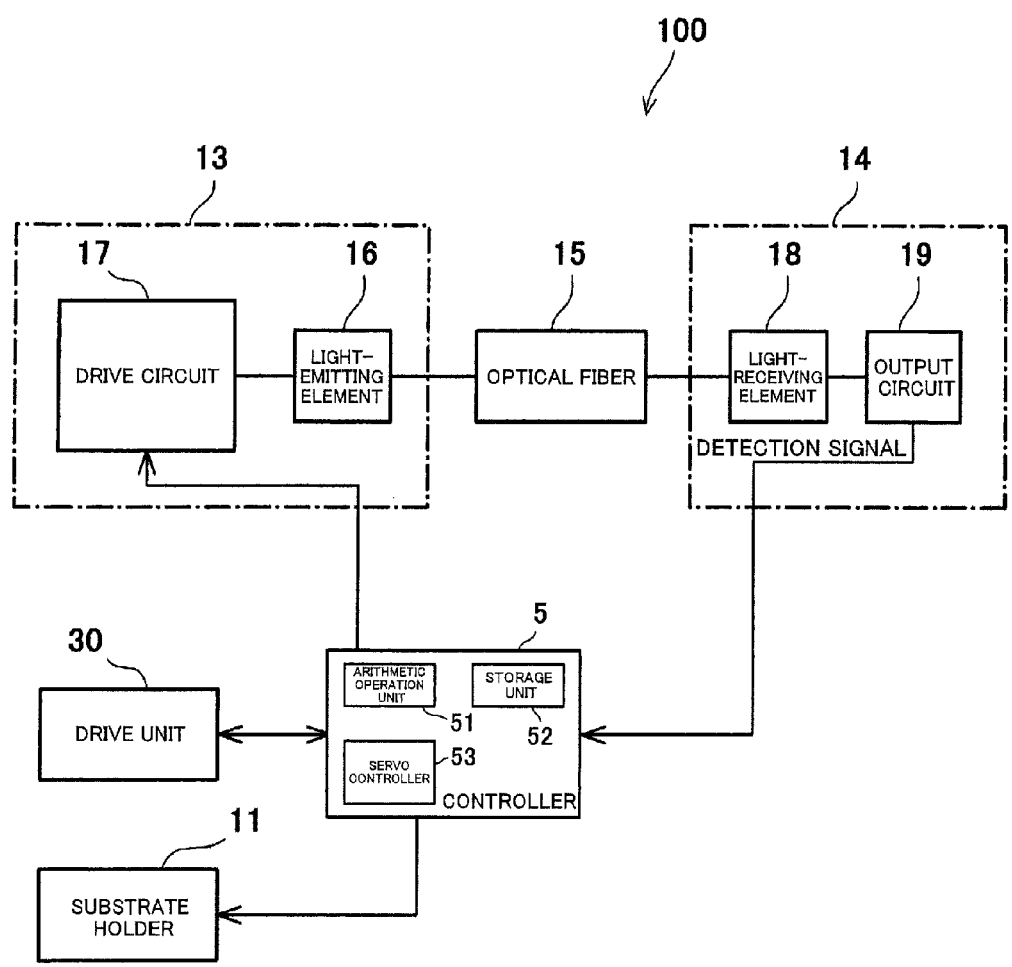
FIG. 3 is a block diagram showing a control system in the robot of FIG. 1.

FIG. 3 is a block diagram showing a control system in the robot 1. As shown in FIG. 3, the controller 5 is connected to the light emitter 13, the light receiver 14, and the substrate holders 11 of the hand 10 and to a drive unit 30 of the robot 1 via control lines. For example, the controller 5 is a robot controller including a computer such as a microcontroller. The controller 5 is not necessarily a single device, but a plurality of devices may form the controller 5. The controller 5 includes an arithmetic operation unit 51, a storage unit 52, and a servo controller 53.

The storage unit 52 stores information such as a basic program of the controller 5 and an operation program of the robot. The arithmetic operation unit 51 performs arithmetic processing for robot control, and generates control commands for the robot 1. The servo controller 53 is configured to control the drive unit 30 of the robot 1 based on the control commands generated by the arithmetic operation unit 51.

The light emitter 13 includes a light-emitting element 16 and a drive circuit 17. The light-emitting element 16 generates and emits detection light. For example, a light-emitting diode or a laser diode is used as the light-emitting element 16. The drive circuit 17 applies a voltage to the light-emitting element 16 to drive the light-emitting element 16. The drive circuit 17 generates the voltage in accordance with a control signal (an electrical input) from the controller 5, and drives the light-emitting element 16 with the voltage.

The light receiver 14 includes a light-receiving element 18 and an output circuit 19. The light-receiving element 18 converts an optical signal into an electrical signal in such a manner that the light-receiving element 18 generates a voltage in accordance with a received light amount when the light-receiving element 18 has received the detection light. For example, a photodiode is used as the light-receiving element 18. The output circuit 19 amplifies the electrical signal and outputs the amplified signal as a detection signal (an electrical output) of the mapping sensor 12.

Each of the optical fibers 15a and 15b is connected to the light emitting element 16 or the light-receiving element 18 via a connector, which is not shown. Thus, in the present embodiment, the light emitter 13 and the light receiver 14 include the light-emitting element 16 and the light-receiving element 18, respectively, and the light-emitting element 16 and the light-receiving element 18 form a transmissive optical sensor.

The substrate holders 11 are controlled such that the pressure of the pushing surface 11a, which contacts the substrate W, is controlled in accordance with a control command from the controller 5. The pushing surface 11a pushes the edge of the substrate W toward the edge grips 11b, thereby holding the substrate W together with the edge grips 11b.

The drive unit 30 includes the actuators that drive the lifting/lowering shaft 3, the first arm 2a, and the second arm 2b shown in FIG. 1. In accordance with control commands from the controller 5, the drive unit 30 operates the actuators driving the lifting/lowering shaft 3, the first arm 2a, and the second arm 2b to move the hand 10 vertically and horizontally.

Mapping Operation

Next, a mapping operation of the hand 10 is described with reference to FIG. 1 and FIG. 2. In a mapping detection operation, the robot 1 controls the movement of the arm 2 to scan, for example, shelves of the cassette 6 from the lowermost shelf to the uppermost shelf sequentially in such a manner that the distal end of the hand 10 is caused to face each of the substrates W stored on the respective shelves (see FIG. 1).

If no substrate W is stored on a scanned shelf, the sensor beam B travels straight through the space between the first distal end portion 10b and the second distal end portion 10c (see FIG. 2). As a result, detection light is received by an end of the optical fiber 15b at the back side of the distal end portion 10c of the hand 10. The light receiver 14 outputs a detection signal of a high level (i.e., an ON signal) to the controller 5. That is, the level of the detection signal is high when no substrate W is stored on the shelf.

On the other hand, if a substrate W is stored on the scanned shelf, the sensor beam B of the mapping sensor 12, which travels through the space between the distal end portion 10b and the distal end portion 10c of the hand, is blocked by the outer peripheral portion of the substrate W. In this case, detection light is not received by the end of the optical fiber 15b at the back side of the distal end portion 10c of the hand 10. Accordingly, the light receiver 14 outputs a detection signal of a low level (i.e., an OFF signal) to the controller 5. That is, the level of the detection signal of the sensor is low when a substrate W is stored on the shelf. In this manner, the controller 5 can sequentially determine regarding each shelf in the cassette 6 whether or not a substrate is stored on the shelf.

Specifying Target Position

As described above, the mapping sensor 12 performs detection based on whether or not the sensor beam B is blocked by a target. In this manner, the controller 5 can specify the position of the target only in one direction (e.g., a direction in which the hand 10 advances straight) as seen from the robot 1. The position of the target as seen from the robot 1 herein means, for example, a coordinate position of the target in a reference coordinate system of the robot 1. In the present embodiment, the robot 1 uses the mapping sensor 12 to specify the plane position of the target, and the robot 1 teaches the specified position to itself.

Figure 4:
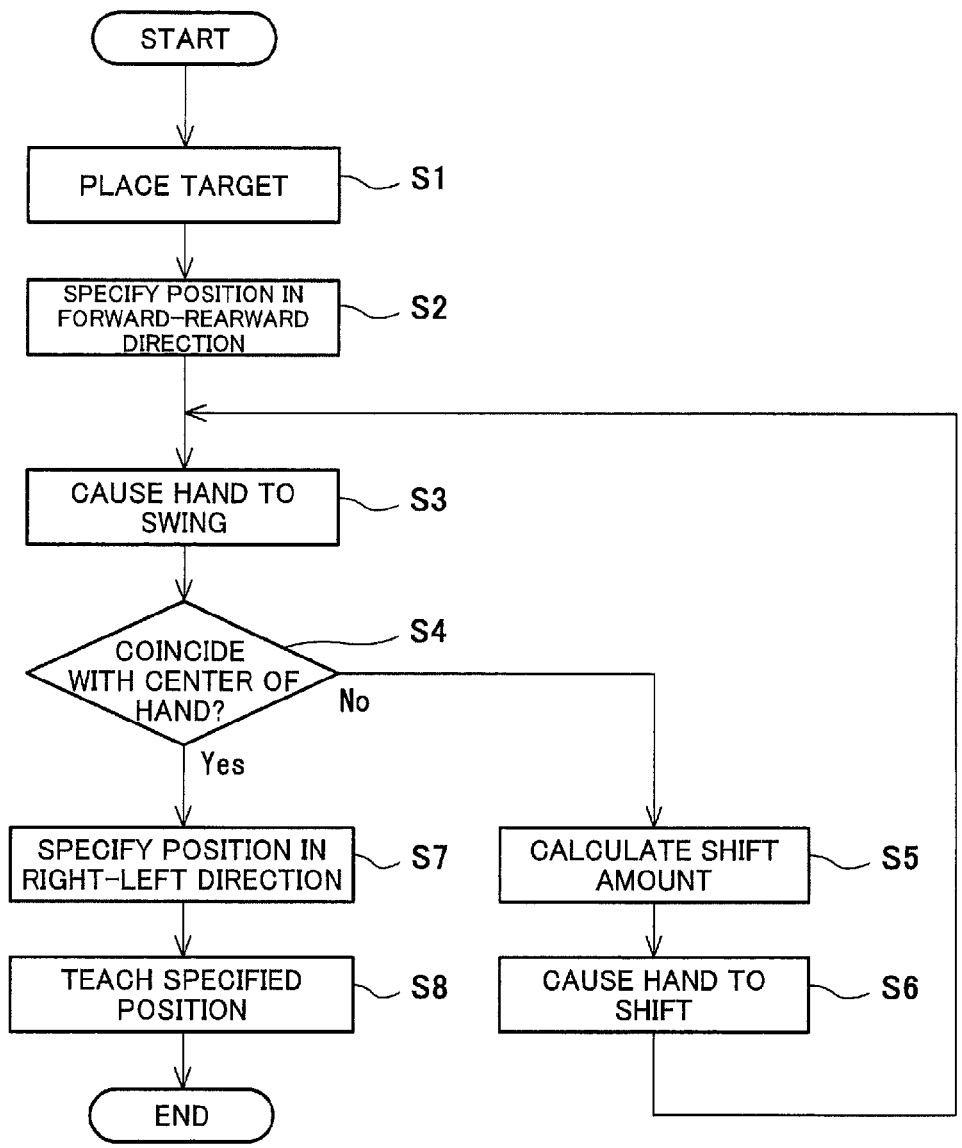
FIG. 4 is a flowchart showing one example of a method of teaching the robot of FIG. 1.
Figure 5:
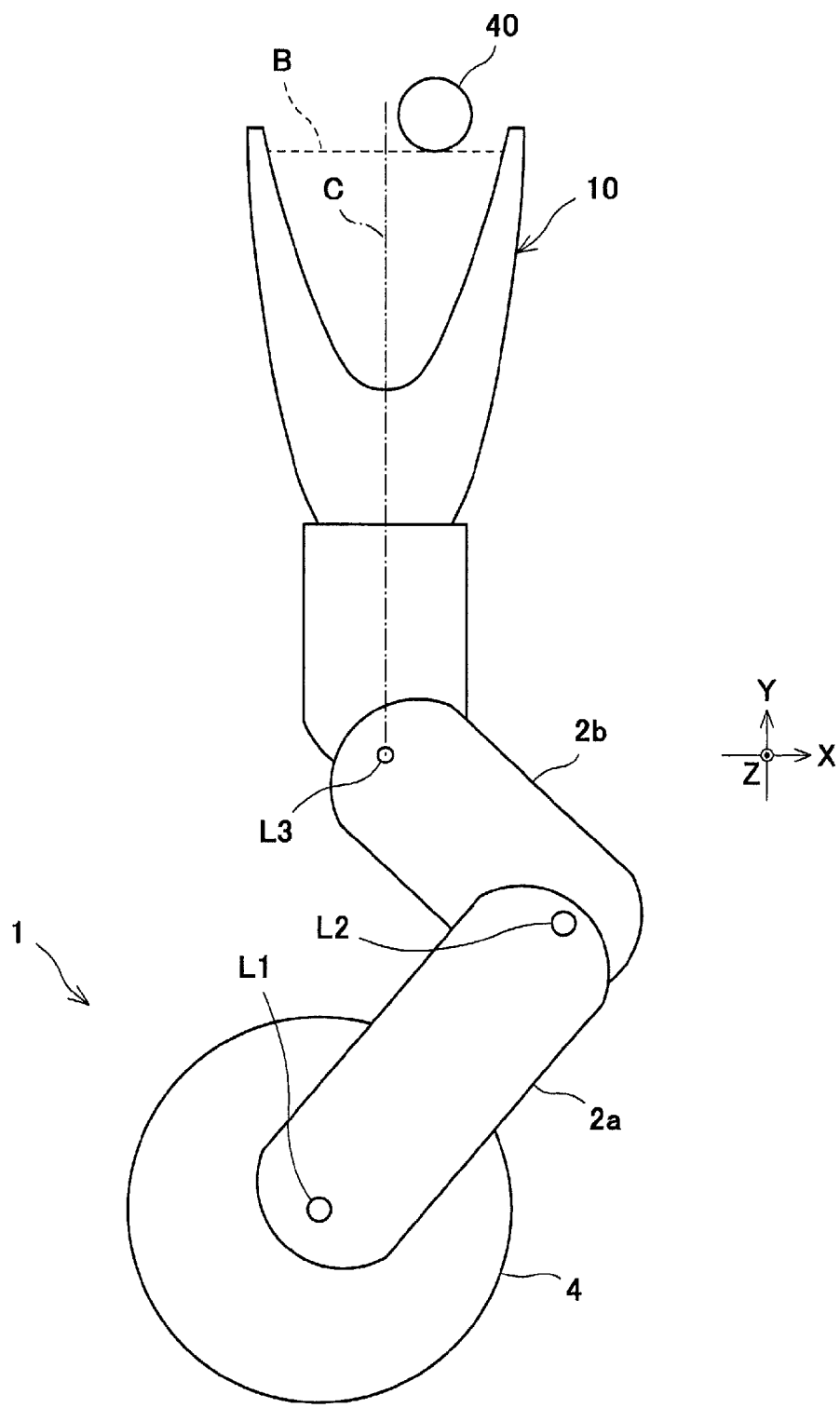
FIG. 5 illustrates an operation of the robot to specify the position of a target in an XY plane.

Hereinafter, a method of teaching the robot 1 is described. FIG. 4 is a flowchart showing one example of the method of teaching the robot 1. FIG. 5 illustrates an operation of the robot to specify the position of a target in an XY plane. As shown in FIG. 5, the controller 5 sets a reference coordinate system of the robot 1. In the coordinate system, for example, the point of intersection between a surface on which the base 4 is set and the rotational axis of the pivot L1 of the first arm 2a serves as the origin; the rotational axis of the pivot L1 serves as the Z-axis; an axis perpendicular to the Z-axis serves as the X-axis; and an axis perpendicular to the Z-axis and the X-axis serves as the Y-axis.

First, prior to teaching, an operator places a target 40 at a taught position (step S1 in FIG. 4). The target 40 may have any shape. As shown in FIG. 5, the target 40 extends in the Z-axis direction and has a columnar shape. The Z-axis direction is the vertical direction. The target 40 is placed at a predetermined taught position that is set, for example, in the cassette 6. At the time, the robot 1 is moved to a predetermined start position. The robot 1 may be moved to the start position in accordance with a program set in advance, or the operator may manually operate the robot 1 to move the robot 1 to the start position.

Next, the controller 5 specifies the position of the target 40 in the forward-rearward direction of the hand 10 (step S2 in FIG. 4). Specifically, the controller 5 operates the arm 2 such that the hand 10 advances straight from a predetermined position. Then, the controller 5 specifies the position of the target 40 in the forward-rearward direction as seen from the robot 1 when the target 40 has blocked the sensor beam B. The forward-rearward direction of the target 40 herein means a direction parallel to the Y-axis in the reference coordinate system of the robot. The controller 5 calculates the position of the hand 10 in the reference coordinate system based on, for example, the dimensions of the links forming the first arm 2a and the second arm 2b and the angles of joint axes when the level of the detection signal has changed from high to low. The calculated position is stored in the storage unit 52. In this manner, the hand 10 of the robot 1 is set such that the sensor beam B of the mapping sensor 12 is positioned at the front of the target 40.

Figure 6:
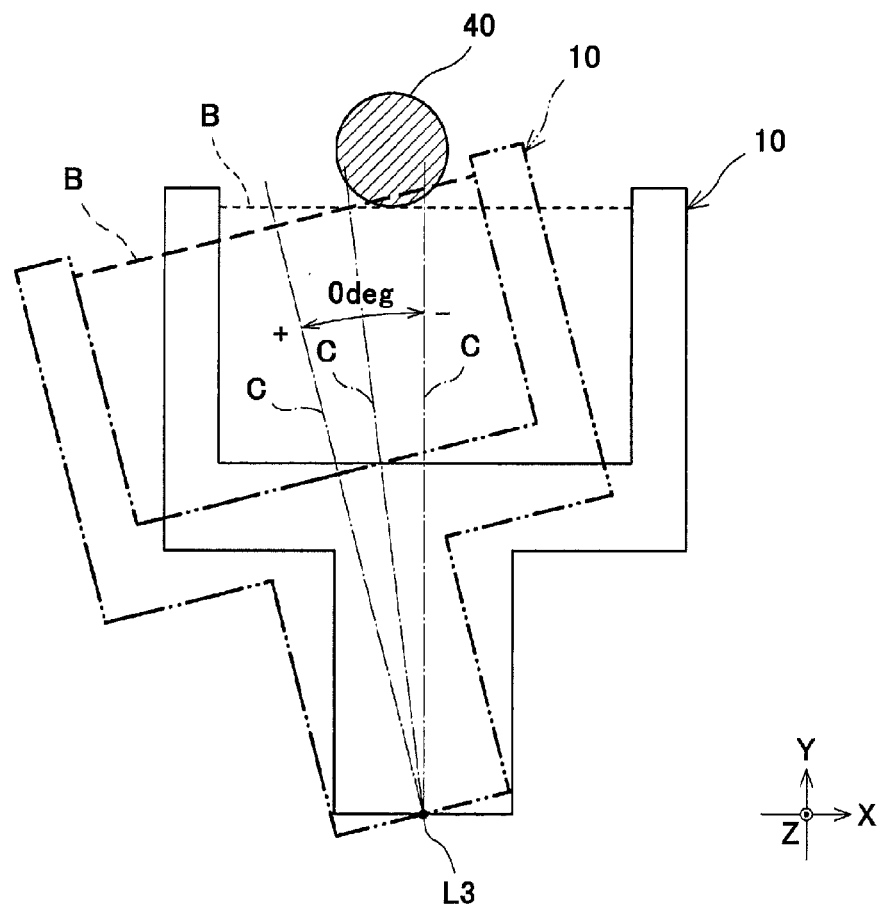
FIG. 6 is a schematic plan view showing a case where the hand of FIG. 5 is caused to swing.

Next, the controller 5 causes the hand 10 to swing horizontally (to the right and left) to scan the target 40 (step S3 in FIG. 4). FIG. 6 is a schematic plan view showing a case where the hand 10 of FIG. 5 is caused to swing. It should be noted that, hereinafter, the hand 10 is shown in the drawings in a simplified manner for the sake of convenience. As shown in FIG. 6, the controller 5 causes the hand 10 to swing about the pivot L3, which is on an axis perpendicular to the optical axis of the sensor beam B, to scan the target 40 in the horizontal direction by means of the sensor beam B. Here, in a state where the level of the detection signal is low, the controller 5 causes the hand 10 to swing about the pivot L3, which is on the central axis C of the hand 10 in its longitudinal direction, to the right and left by the same angle (e.g., 10 degrees to the right and 10 degrees to the left). It should be noted that the pivot of the hand 10 is only required to be on the central axis C of the hand in its longitudinal direction. For example, the hand may be caused to swing about the pivot L1 or pivot L2 shown in FIG. 1.

Figure 7:
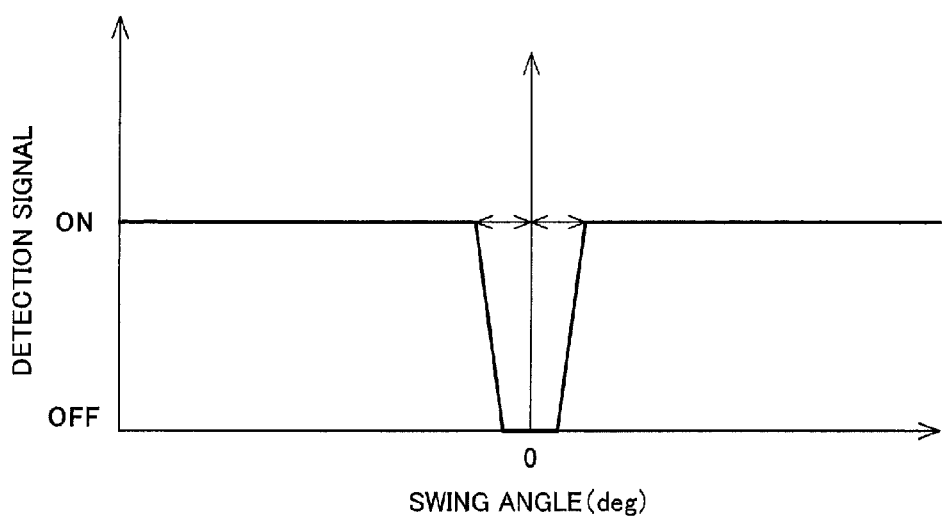
FIG. 7 shows the waveform of a detection signal of a mapping sensor in a case where the center of the hand has coincided with the target.
Figure 8:
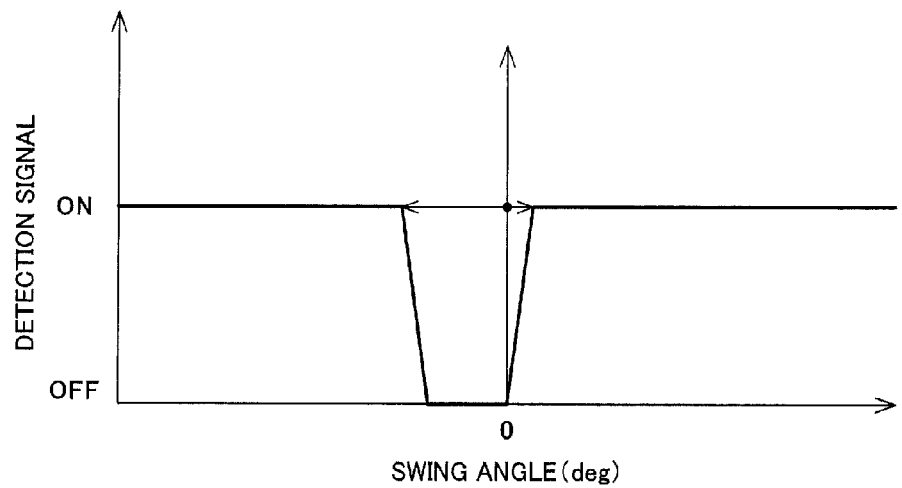
FIG. 8 shows the waveform of the detection signal of the mapping sensor in a case where the center of the hand has not coincided with the target.

Next, based on the detection signal of the mapping sensor 12, the detection signal having changed owing to the swinging of the hand 10, the controller 5 determines whether or not the target 40 has coincided with a position along the central axis C of the hand 10 in its longitudinal direction (step S4). FIG. 7 shows the waveform of the detection signal of the mapping sensor 12 in a case where the central axis C of the hand 10 has coincided with the target 40, and FIG. 8 shows the waveform of the detection signal of the mapping sensor 12 in a case where the central axis C of the hand 10 has not coincided with the target 40. The vertical axis represents the detection signal, and the horizontal axis represents the swing angle. As shown in FIG. 7, if the central axis C of the hand 10 has coincided with the target 40, the value of the detection signal indicates symmetry in a predetermined swing angle range whose center is 0 degree. On the other hand, as shown in FIG. 8, if the central axis C of the hand 10 has not coincided with the target 40, the value of the detection signal does not indicate symmetry in the predetermined swing angle range whose center is 0 degree. Accordingly, the controller 5 determines whether or not the target 40 has coincided with a position along the central axis C of the hand 10 in its longitudinal direction based on whether or not the value of the detection signal of the mapping sensor 12 indicates symmetry in the predetermined swing angle range whose center is 0 degree.

Next, if it is determined that the target 40 has not coincided with the position (NO in step S4), the controller 5 calculates an offset amount of the hand 10 based on the detection signal of the mapping sensor 12, which has changed owing to the swinging of the hand 10 (step S5), For example, as shown in FIG. 8, the controller 5 calculates an offset amount by comparing the magnitude of an integral value of the detection signal (absolute value) when the hand 10 is caused to swing in a positive direction (i.e., to the right) with the magnitude of an integral value of the detection signal (absolute value) when the hand 10 is caused to swing in a negative direction (to the left).

Figure 9:
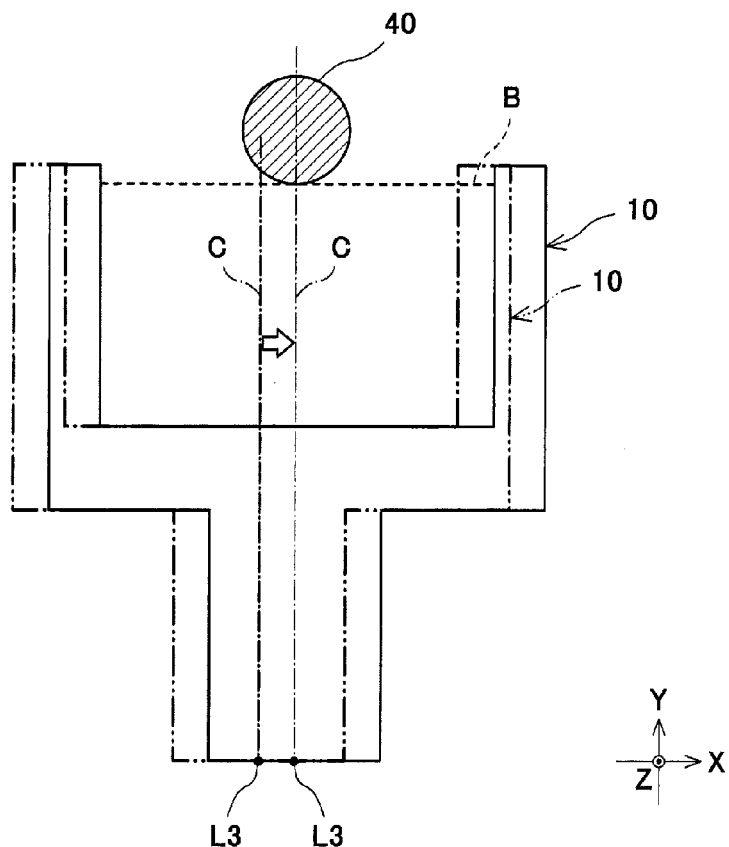
FIG. 9 is a schematic plan view showing a case where the hand is caused to shift.

Next, the controller 5 causes the hand 10 to shift (step S6). FIG. 9 shows a case where the hand 10 is caused to shift. As shown in FIG. 9, the controller 5 causes the hand 10 to shift to the right along the optical axis of the sensor beam B in accordance with the calculated offset amount. Here, the controller 5 causes the hand 10 to shift in the X-axis direction of the reference coordinate system of the robot. It should be noted that the shift amount of the hand 10 is, for example, set to such a value that the integral value of the detection signal (absolute value) when the hand 10 is caused to swing in the positive direction (i.e., to the right) as shown in FIG. 8 becomes equal to the integral value of the detection signal (absolute value) when the hand 10 is caused to swing in the negative direction (to the left). Then, after causing the hand 10 to shift, the controller 5 returns to step S3 and repeats the above-described steps until the central axis C of the hand 10 coincides with the target 40. That is, the controller 5 repeats the above-described steps until the value of the detection signal indicates symmetry in the predetermined swing angle range whose center is 0 degree as shown in FIG. 7. In this manner, even if there are zeroing errors and dimensional errors of the robot 1, the target 40 can be made coincide with a position along the central axis C of the hand 10 in its longitudinal direction, i.e., coincide with the center of the line of the sensor beam B, and the plane position of the target 40 as seen from the robot 1 can be specified.

Next, if it is determined that the target 40 has coincided with the position (YES in step S4), the controller 5 specifies the position of the target in the right-left direction as seen from the robot (step S7). The right-left direction of the target 40 herein means a direction parallel to the X-axis in the reference coordinate system of the robot 1. At the time, the controller 5 calculates the position of the hand 10 in the reference coordinate system based on the dimensions of the links forming the first arm 2a and the second arm 2b and the angles of joint axes. The calculated position is stored in the storage unit 52.

Finally, the controller 5 teaches the robot 100 the position of the hand 10, the position corresponding to the taught position, based on the positions of the target 40 specified in the forward-rearward direction and the right-left direction (step S8).

As described above, according to the present embodiment, the position of the target 40 can be specified precisely. This makes it possible to improve the precision in teaching the robot 1. There is a case where even if the hand 10 is actually facing perpendicularly to the target 40, the position (orientation) of the hand 10 recognized by the robot 1 is different from the actual position (orientation). In this case, if the hand 10 is caused to advance straight from the taught position of the hand 10, the target 40 will deviate from the central axis C of the hand 10. That is, even if the central axis C of the hand 10 is perpendicular to the target 40, the hand 10 may deviate in the transverse direction relative to a distance between the blocked position of the sensor beam B and the position where the hand 10 holds the substrate W at the center of the substrate. If the distance to advance straight is the distance from the edge to the center of a wafer whose diameter is 300 mm, then the amount of deviation in the transverse direction in a case where the center of the hand 10 deviates from the target 40 by 0.3 degrees can be calculated by using an equation below.

$$150 \text{ mm} \times \sin(0.3) = 0.79 \text{ mm}$$

In this respect, in order to confirm advantageous effects provided by the present embodiment, the inventors of the present invention estimated a positional deviation relative to the target 40 by applying the method disclosed in U.S. Pat. No. 7,522,267. As a result, the positional deviation relative to the target 40 was 1.6 mm in a case where the deviation of the center of the hand 10 from the target 40 was 0.3 degrees. Thus, according to the present embodiment, sufficient precision can be obtained compared to the conventional art.

Embodiment 2

Next, Embodiment 2 is described with reference to FIG. 10. In the description below, the same configurations as those described in Embodiment 1 are omitted, and differences from Embodiment 1 are only described.

Figure 10:
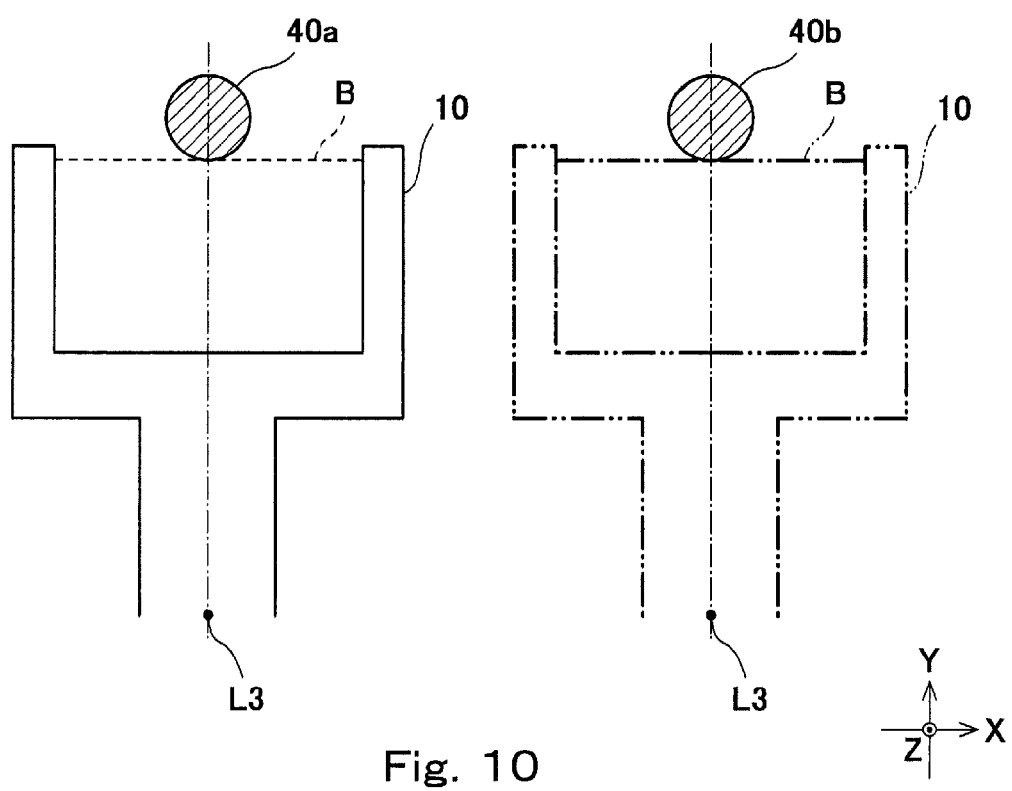
FIG. 10 is a schematic plan view showing the hand and targets in Embodiment 2.

FIG. 10 is a plan view schematically showing the hand 10 and targets 40 according to Embodiment 2. As shown in FIG. 10, Embodiment 2 is different from Embodiment 1 in that, in Embodiment 2, two targets 40a and 40b are placed at two taught positions, respectively, and steps S2 to S8 are performed for each of the two targets. Based on relative positions of specified positions of each of the targets 40a and 40b and a design distance between the targets 40a and 40b, a deviation in the case of causing the hand 10 to advance straight by a predetermined distance from the taught position of the hand 10 is adjusted. For example, when the robot 1 is to hold a substrate W, a deviation in the case of causing the hand 10 to advance straight from the edge of the substrate in the cassette to the center of the substrate can be suitably adjusted.

It should be noted that, in the above-described embodiment, the X-axis in the reference coordinate system of the robot 1 coincides with the shifting direction of the hand 10. At the time of causing the hand to shift along the optical axis of the sensor beam B, the hand 10 is caused to shift in the X-axis direction of the coordinate system of the robot (see FIG. 9). However, the direction of the optical axis of the sensor beam B is not necessarily parallel to each of the axes in the reference coordinate system of the robot.

Figure 11:
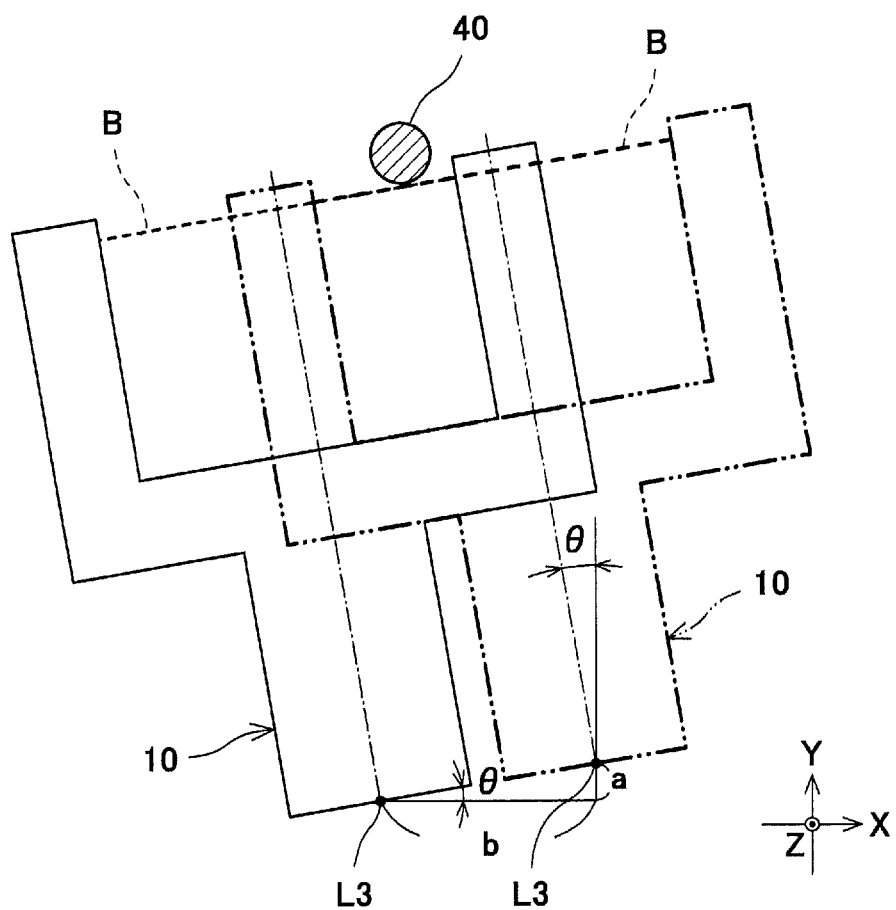
FIG. 11 is a schematic plan view showing a case where a coordinate axis in a reference coordinate system of the robot is inclined relative to a shifting direction of the hand.

FIG. 11 is a schematic plan view showing a case where a coordinate axis in the reference coordinate system of the robot is inclined relative to the shifting direction of the hand. As shown in FIG. 11, the shifting direction of the hand 10 (i.e., the direction of the optical axis) is inclined by an angle θ relative to the X-axis in the reference coordinate system of the robot. In this case, an inclination θ of the optical axis of the sensor beam B relative to the X-axis in the base coordinate system of the robot (i.e., an inclination of the central axis C of the hand 10 relative to the Y-axis in the reference coordinate system) is calculated in advance. For example, two positions where the sensor reacts to the target 40 are obtained, and the inclination θ is obtained from a moving amount b along the X-axis and a moving amount a along the Y-axis.

$$\theta = \tan^{-1}(a/b) \quad (1)$$

The controller 5 causes the hand 10 to shift along the optical axis of the sensor beam B in a manner to maintain the calculated inclination θ. In this manner, the hand can be caused to shift precisely.

Although in the above-described embodiment the mapping sensor 12 is of a transmissive type (see FIG. 2), the mapping sensor 12 may be of a reflective type, so long as the mapping sensor 12 is configured such that the sensor beam B travels straight through the space between the first distal end portion 10b and the second distal end portion 10c. Specifically, the mapping sensor 12 may be configured such that the light emitter 13 and the light receiver 14 are provided on the distal end of one of the first distal end portion 10b and the second distal end portion 10c, and a reflective member may be provided on the other one of the first distal end portion 10b and the second distal end portion 10c. For example, the sensor beam B emitted from the light emitter 13 of the first distal end portion 10b is reflected by the reflective member of the second distal end portion 10c, and received by the light receiver 14 of the first distal end portion 10b. Also in this configuration, the received light amount decreases when the target 40 blocks the laser beam B. Therefore, whether or not the target 40 has blocked the sensor beam B can be detected. Thus, also in the case of using such a reflective mapping sensor 12, the same advantageous effects as those described in the above embodiments can be obtained.

Although in the above-described embodiments the robot 1 is a horizontal articulated conveying robot, the robot 1 is not thus limited. The robot 1 may be any robot, so long as the above-described mapping sensor is provided on the distal end of a hand of the robot.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

INDUSTRIAL APPLICABILITY

The present invention is useful when applied to a robot including a mapping sensor provided on its distal end.

REFERENCE SIGNS LIST 1 robot
2 arm
3 lifting/lowering shaft
4 base
5 controller
6 cassette
7 cassette stand
10 hand
11 substrate holder
12 mapping sensor
13 light emitter
14 light receiver
15a, 15b optical fiber
16 light-emitting element
17 drive circuit
18 light-receiving element
19 output circuit
20 attachment plate
30 driving unit
40 target
51 arithmetic operation unit
52 storage unit
53 servo controller

The invention claimed is:

1. A method of teaching a robot, the robot including:
a robot arm freely movable at least in two axial directions that are directions in an X-axis and a Y-axis;
a hand mounted to a distal end of the robot arm and including two branching distal end portions that are a first distal end portion and a second distal end portion;
a mapping sensor configured such that a sensor beam travels straight through space between the first and second distal end portions, the mapping sensor detecting whether or not a target has blocked the sensor beam; and a controller configured to control an operation of the robot arm,
the method comprising:
a placing step of placing the target at a taught position;
a first specifying step of causing the hand to advance straight from a predetermined position and specifying a position of the target in a forward-rearward direction in a reference coordinate system of the robot when the target has blocked the sensor beam;

a swinging step of causing the hand to swing about a predetermined pivot, which is on an axis perpendicular to an optical axis of the sensor beam, to scan the target in a horizontal direction by means of the sensor beam;

a determining step of determining whether or not the target has coincided with a position along a central axis of the hand in its longitudinal direction based on a detection signal of the mapping sensor, the detection signal of the mapping sensor having changed due to the swinging of the hand;

a shifting step of, if it is determined in the determining step that the target has not coincided with the position, calculating an offset amount of the hand based on the detection signal of the mapping sensor, the detection signal of the mapping sensor having changed due to the swinging of the hand, and causing the hand to shift to either right or left along the optical axis of the sensor beam in accordance with the calculated offset amount;

a second specifying step of, if it is determined in the determining step that the target has coincided with the position, specifying a position of the target in a right-left direction in the reference coordinate system of the robot; and a teaching step of teaching the robot a position of the hand, the position corresponding to the taught position, based on the positions of the target specified in the forward-rearward direction and the right-left direction.

2. The method of teaching a robot according to claim 1, wherein
the swinging step includes causing the hand to swing about the predetermined pivot, which is on the axis perpendicular to the optical axis of the sensor beam, to right and left by a same angle.

3. The method of teaching a robot according to claim 1, wherein
the determining step includes determining whether or not the target has coincided with the position along the central axis of the hand in its longitudinal direction based on whether or not a value of the detection signal of the mapping sensor indicates symmetry in a predetermined swing angle range whose center is 0 degree.

4. The method of teaching a robot according to claim 1, further comprising a step of calculating an inclination of the optical axis of the sensor beam relative to an axis in a reference coordinate system of the robot, wherein
the shifting step includes causing the hand to shift along the optical axis of the sensor beam in a manner to maintain the calculated inclination.

5. The method of teaching a robot according to claim 1, wherein
the placing step includes placing two targets at two taught positions, respectively,
the first specifying step, the swinging step, the determining step, the shifting step, the second specifying step, and the teaching step are performed for each of the two targets, and the method further comprises an adjusting step of adjusting a deviation in a case of causing the hand to advance straight by a predetermined distance from the taught position of the hand based on relative positions of the specified positions of each of the targets and a design distance between the targets.

6. A robot comprising:
a robot arm freely movable at least in two axial directions that are directions in an X-axis and a Y-axis;
a hand mounted to a distal end of the robot arm and including two branching distal end portions that are a first distal end portion and a second distal end portion;
a mapping sensor configured such that a sensor beam travels straight through space between the first and second distal end portions, the mapping sensor detecting whether or not a target has blocked the sensor beam; and
a controller configured to control an operation of the robot arm, wherein
the controller:
causes the hand to advance straight from a predetermined position, and in a state where the target is placed at a taught position, specifies a position of the target in a forward-rearward direction in a reference coordinate system of the robot when the target has blocked the sensor beam;
causes the hand to swing about a predetermined pivot, which is on an axis perpendicular to an optical axis of the sensor beam, to scan the target in a horizontal direction by means of the sensor beam;
determines whether or not the target has coincided with a position along a central axis of the hand in its longitudinal direction based on a detection signal of the mapping sensor, the detection signal of the mapping sensor having changed due to the swinging of the hand;
if it is determined that the target has not coincided with the position, calculates an offset amount of the hand based on the detection signal of the mapping sensor, the detection signal of the mapping sensor having changed due to the swinging of the hand, and causes the hand to shift to either right or left along the optical axis of the sensor beam in accordance with the calculated offset amount;
if it is determined that the target has coincided with the position, specifies a position of the target in a right-left direction in a reference coordinate system of the robot; and
teaches the robot a position of the hand, the position corresponding to the taught position, based on the positions of the target specified in the forward-rearward direction and the right-left direction.

* * * * *